April 9, 1957 W. J. CERVENY ET AL 2,788,446

OSCILLATOR

Filed Oct. 21, 1953

INVENTORS
WALTER J. CERVENY
BY DAVID S. WISE
Hudson, Boughton,
Williams, David & Hoffmann
ATTORNEYS United States Patent Office 2,788,446
Patented Apr. 9, 1957

2,788,446

OSCILLATOR

Walter J. Cerveny, Garfield Heights, Cleveland, and David S. Wise, Cleveland, Ohio, assignors to Cleveland Patents, Incorporated, Cleveland, Ohio, a corporation of Ohio Application October 21, 1953, Serial No. 387,393
9 Claims. (Cl. 250—36)

The present invention relates to oscillators and more particularly to frequency modulated oscillators having a transmission line tuning element.

The principal object of the present invention is the provision of a new and improved oscillator for producing a radio frequency signal, particularly a radio frequency signal above 300 mc., having transmission line tuning means for determining the frequency of oscillation of the oscillator and for frequency modulating the oscillator, the tuning means being adapted to provide a wide linear sweep about a center frequency.

Another object of the present invention is the provision of a new and improved oscillator having a transmission line tuning element for determining the frequency of oscillation of the oscillator and variable circuit means responsive to an applied voltage for varying the effective length of the transmission line to frequency modulate the oscillator, the circuit means being located so as not to adversely affect the efficiency of the oscillator.

Another object of the present invention is the provision of a new and improved oscillator having a tuning circuit including a transmission line of variable length and movable means for electrically terminating the line comprising capacitive circuit elements having an electric field responsive dielectric whereby the effective length of the line may be varied by the application of a varying potential to the circuit elements, the capacitive elements being such that they are free from hysteresis effects and stable in their electrical characteristics.

Another object of the present invention is the provision of a new and improved frequency modulated oscillator having a variable length transmission line in the tuning circuit for determining the frequency of oscillation of the oscillator and means for frequency modulating the oscillator by varying the effective length of the transmission line comprising a variable circuit element so connected in the oscillator circuit that the Q of the circuit means has little effect on the operation of the oscillator.

Another object of the present invention is the provision of a frequency modulated oscillator having tuning means including a transmission line and movable conducting means for terminating and varying the effective length of the line, the conducting means comprising a variable capacitor having an electric field responsive dielectric, the transmission line and the conducting means being so arranged that the oscillator may be frequency modulated by applying a varying potential to the capacitor without causing amplitude modulation of the output signal from the oscillator.

Another object of the present invention is the provision of a new and improved transmission line tuning circuit having field responsive capacitors in combination therewith to vary the effective length of the line.

Figure 1:
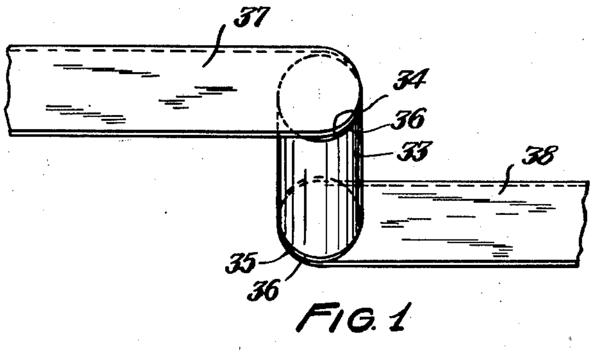
Figure 2:
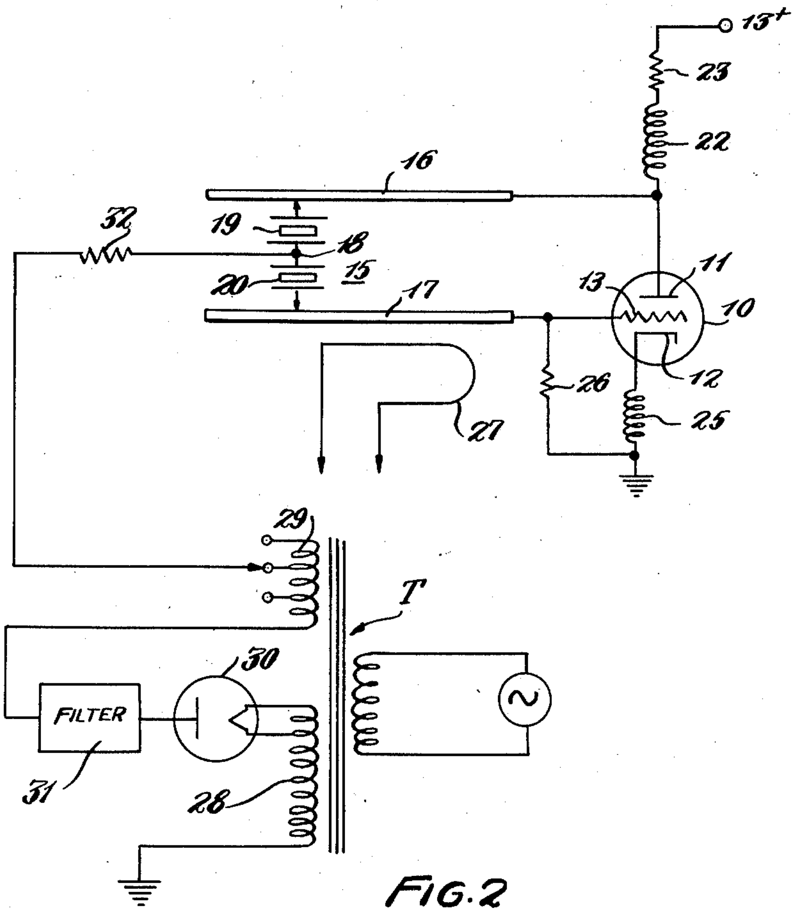

Other objects and advantages of the invention will be apparent from the following detail description of the preferred form of the invention, reference being made to the accompanying drawings forming a part hereof and wherein, Fig. 1 is a perspective view of a capacitor suitable for use in the tuning circuit of the present invention; and Fig. 2 is a schematic circuit diagram of an oscillator embodying the present invention.

The present invention contemplates an oscillator which is tuned by a variable length transmission line and which may be frequency modulated by applying a varying unidirectional potential to a variable circuit means, particularly a capacitor or capacitors connected between the opposite sides of the transmission line. Capacitors suitable for use with the present invention are of the type that have an electric field responsive dielectric so that the oscillator may be frequency modulated by the application of a varying unidirectional potential thereto to vary the capacity of the capacitors and the effective length of the transmission line. The term effective length as used herein refers to the length of a transmission line in free space having the electrical characteristics of the transmission line in question, as will be well understood by those skilled in the art. Preferably the capacitors replace the conventional shorting bar used with the usual transmission line tuning element and are movable along the transmission line for determining the center frequency of the frequency modulated signal. The use of the capacitors to replace the shorting bar is advantageous because the Q of the capacitor has little effect upon the operation of the oscillator since the capacitor is connected across the transmission line at approximately a voltage minimum point.

Electric field responsive capacitors normally have barium titanate dielectrics. One characteristic of such dielectrics is that the Q of the dielectric varies according to the applied potential. This variation of Q normally presents a problem of output voltage control when such capacitors are used in oscillator circuits. The location of the capacitors at a voltage minimum along the transmission line minimizes the effect of a change in Q of the capacitor and eliminates the need for introducing other circuit elements to compensate for the change in Q to maintain the output of the oscillator at a constant level.

Referring to the drawings, the oscillator circuit for the preferred embodiment of the present invention is schematically shown in Fig. 2 and comprises a vacuum tube 10 having a plate 11, cathode 12 and a grid or control element 13. A transmission line 15 comprised of two parallel conductors 16, 17 is connected between the plate 11 and the grid 13 of the tube 10. The transmission line 15 is electrically terminated by a conducting means 18 which is movable along the conductors 16, 17 and which comprises serially connected capacitors 19, 20. The position of the conducting means 18 along the conductors 16, 17 determines the center of frequency of oscillation of the oscillator. The plate 11 of tube 10 is connected to the B+ terminal of a suitable power supply through a high frequency choke 22 and a plate load resistor 23 connected in series. The cathode 12 is connected to ground through a high frequency choke coil 25 and the grid 13 is connected to ground through grid-biasing resistor 26. An output loop 27 is coupled to conductors 16, 17 of transmission line 15.

The capacitors 19 and 20 have dielectrics which are electric field responsive so that the capacity of the condensers may be determined by the application of a potential thereto. The effective electrical length of the line and consequently the frequency to which the oscillator is tuned may be varied by varying the capacity of the capacitors 19, 20. Suitable means is provided for applying a varying unidirectional modulating potential to the capacitors 19, 20 and comprises a transformer T having two secondary coils 28, 29. One side of the secondary coil 28 is connected to ground and the other side is connected to the cathode of a rectifier tube 30. The plate of the rectifier tube 30 is connected to one side of the secondary coil 29 through suitable filtering means 31 so that the output of the rectifier will have the A. C. output of secondary coil 29 superimposed thereon. The filtering means 31 is provided to substantially level the output of rectifier 30. The other side of the secondary coil 29 is connected to the electrodes of condensers 19 and 20 which are directly connected to each other through an isolation resistor 32. The secondary coil 29 is provided with a plurality of taps so that an A. C. voltage of different magnitudes may be selectively superimposed upon the output of rectifier tube 30.

If the sweep of the oscillator is to be uniform on either side of a center frequency the D. C. bias provided by rectifier 30 must be of sufficient magnitude to prevent reversal of polarity of the modulating voltage applied to capacitors 19, 20.

The capacitors 19, 20 preferably are of the form illustrated in Fig. 1 and comprise a cylinder 33 of barium titanate material having opposed generally parallel end faces 34, 35. Each end face 34, 35 is entirely covered with a silver electrode 36. It is important for reasons hereinafter pointed out that the electrodes 36 completely cover the end faces 34, 35. The connections 37, 38 to the capacitor are soldered to the electrodes 36 on the end faces 34, 35 respectively.

Titanate materials which have a Curie temperature of at least 40° C. and are comprised essentially of alkaline earth titanates with minor additions of an oxide of a metal selected from the group consisting of zirconium and tin with barium titanate comprising at least approximately 85% of the titanates and the total of the alkaline earth titanates constituting at least about 90% of the dielectric have proved satisfactory for use with the present invention. These materials when formed into a condenser as above described exhibit stable electric characteristics and are free from a hysteresis effect provided the electrodes 36 cover the entire surface of the ends 34, 35. Titanate materials generally exhibit an effect similar to the hysteresis effect in ferro-magnetic materials which would normally make them unsuitable for use in a frequency modulated oscillator since the dielectric constant must be reversible, i. e. independent of the direction of change of the voltage, if a uniform sweep is to be obtained. The following table gives specific composition of two titanate materials made according to the above formulation:

| Component | Percent by weight | |
|---|---|---|
| | A | B |
| BaO | 51.74 | 63.07 |
| SrO | 4.28 | -------- |
| CaO | 3.43 | -------- |
| $TiO_2$ | 33.52 | 32.31 |
| $ZrO_2$ | 5.11 | -------- |
| $SnO_2$ | -------- | 2.64 |
| MgO | 0.20 | 1.20 |
| $Al_2O_3$ | 0.40 | 0.35 |
| $SiO_2$ | 1.42 | 0.42 |
| $Fe_2O_3$ | 0.05 | -------- |

As a matter of practice we have found that a D. C. bias of approximately 900 volts on capacitors 19, 20 will cause the capacitors when constructed as above described to operate over that portion of its hysteresis curve where the sweep of the generator will be symmetrical on either side of its center frequency. Good results were obtained with a capacitor of the order of 40 to 50 micromicrofarads measured without the application of the D. C. potential. The particular capacitors used were approximately .032 inch thick and .050 inch in diameter. The isolation resistor 32 preferably has a resistance of the order of 100,000 ohms.

By constructing an oscillator as above described we have obtained linear sweep widths of approximately 100 mc. We know of no reason why larger sweep widths cannot be obtained by selection of suitable circuit elements and by the use of capacitors of sufficient capacity. While we have utilized two serially connected capacitors across the transmission line 15, more than two capacitors could be used if so desired. A single barium titanate capacitor could also be used if means were provided to prevent the modulating voltage from being applied to the grid or plate, as the case may be, of the oscillator tube 10.

It will be seen from the foregoing that the present invention provides a new and improved wide sweep frequency modulated oscillator, particularly one adapted to provide a signal above 300 mc. The output of the oscillator is free from amplitude modulation and electric field responsive capacitors are utilized in the tuning circuit without adversely affecting the efficiency of the oscillator and without the necessity of introducing compensating circuit elements to compensate for the change in Q of the field responsive capacitors with changes in the biasing potentials across the capacitors.

Although the preferred embodiment of the present invention has been described in considerable detail, it will be understood, of course, that the invention is not to be regarded as correspondingly limited in scope but includes all changes and modifications within the scope of the claims hereof.

Having thus described our invention, we claim:

1. An oscillator for producing a radio frequency signal including a tuning circuit for determining the frequency of oscillation of the oscillator comprising a parallel conductor transmission line, the effective length of the line controlling the frequency of oscillation of said oscillator, means for varying the effective length of said line comprising a circuit element of a variable electrical characteristic connected between the opposite sides of said line for terminating said line, and means for continuously varying said characteristic of said element to frequency modulate the oscillator.

2. An oscillator for producing a radio frequency signal including a tuning circuit for determining the frequency of oscillation of the oscillator comprising a parallel conductor transmission line, the effective length of the line controlling the frequency of oscillation of said oscillator, means for varying the effective length of said line comprising a variable capacitive circuit element connected between the opposite sides of said line for terminating said line, and means for varying the capacity of said element to frequency modulate the oscillator.

3. In an oscillator for generating radio frequency signals, a tuning circuit for determining the frequency of oscillation of the oscillator comprising a parallel conductor transmission line, electrical conducting means connecting the opposite sides of said line at approximately a voltage minimum point along the line comprising a capacitor having an electric field responsive dielectric whereby the effective length of the line may be varied by varying the capacity of said capacitor, and means for applying a varying potential to said capacitor for frequency modulating said oscillator, the dielectric constant of said dielectric as a function of voltage being reversible for the range of the varying potential applied thereto and being linear in its response to the potential.

4. In an oscillator for generating radio frequency signals, a tuning circuit for determining the frequency of oscillation of the oscillator comprising a parallel conductor transmission line, electrical conducting means connecting the opposite sides of said line for terminating said line comprising serially connected capacitors each having one side connected to a common junction point and each having an electric field responsive dielectric whereby the effective length of the line may be varied by varying the capacity of said capacitors, and means for applying a variable unidirectional potential to said capacitors and having a connection to said junction point.

5. In an oscillator for generating radio frequency signals, a tuning circuit comprising a parallel conductor transmission line, electrical conducting means connecting the opposite sides of said line for terminating the line and movable therealong for varying the length of said line and determining the frequency of oscillation of said oscillator, said electrically conducting means comprising serially connected capacitors each having one side connected to a common junction point and each having an electric field responsive dielectric whereby the effective length of the line may be varied by varying the capacity of said capacitors, and means for applying a varying unidirectional potential to said capacitors for frequency modulating said oscillator, the last-said means having a connection to said junction point.

6. An oscillator for producing a radio frequency signal including a tuning circuit comprising a parallel conductor transmission line, the electrical length of the line controlling the frequency of oscillation of said oscillator, means for varying the effective length of said line comprising a capacitive circuit element connected between the opposite sides of said line at approximately a voltage minimum point along said line said element having an electric field responsive dielectric having a dielectric constant that varies with the change in voltage across said element and which is independent of the direction of change of voltage and is comprised essentially of alkaline earth titanates with minor additions of one of a group of $ZrO_2$ and $SnO_2$, the alkaline earth titanates constituting at least about 90% by weight of the dielectric with barium titanate constituting at least about 85% of the titanates, and means for applying a varying potential to said element for varying the dielectric constant thereof to frequency modulate the oscillator, said dielectric being linear in its response over the range of said varying potential.

7. A frequency modulated oscillator comprising a vacuum tube having at least a cathode, an anode, and a control element, a transmission line connected between the plate and control element of said tube, the electrical length of the line determining the frequency of oscillation of the oscillator, electrically conducting means movable along said line for varying the length thereof and for determining the carrier frequency, said means comprising a capacitor having a dielectric responsive to electric fields, and means to apply a periodically varying potential to said capacitor to frequency modulate said oscillator, the dielectric constant of said dielectric as a function of voltage being reversible over the range of said potential and the response to said potential being substantially linear.

8. A frequency modulated oscillator comprising a vacuum tube having at least a cathode, an anode, and a control element, a transmission line connected to said control element for determining the frequency of oscillation of the oscillator, electrically conducting means movable along said line for varying the length thereof and for determining the carrier frequency, said means comprising serially connected capacitors each having one side connected to a common junction point and each having a dielectric responsive to electric fields, and means having a connection to said junction point for applying a periodically varying unidirectional potential to said capacitors to frequency modulate said oscillator, the dielectric constant of said dielectric being independent of the direction of change of said potential and the response of said dielectric to said potential being substantially linear.

9. A frequency modulated oscillator as defined in claim 7 wherein said dielectric is comprised essentially of alkaline earth titanates with minor additions of one of a group of $ZrO_2$ and $SnO_2$, the alkaline earth titanates constituting at least 90% by weight of the dielectric with barium titanate constituting at least 85% of the titanates.

References Cited in the file of this patent

UNITED STATES PATENTS

| | | |
|---|---|---|
| 2,182,377 | Guenella | Dec. 5, 1939 |
| 2,402,516 | Wainer | June 18, 1946 |
| 2,461,307 | Antalek | Feb. 8, 1949 |
| 2,473,556 | Wiley | June 21, 1949 |
| 2,505,022 | Wheeler | Apr. 25, 1950 |
| 2,510,842 | Strutt, et al. | June 6, 1950 |
| 2,533,140 | Rodriguez | Dec. 5, 1950 |
| 2,591,792 | Donley | Apr. 8, 1952 |
| 2,611,822 | Bliss | Sept. 23, 1952 |
| 2,677,799 | Forster et al. | May 4, 1954 |

FOREIGN PATENTS

| | | |
|---|---|---|
| 389,346 | Great Britain | Mar. 16, 1943 |